(12) United States Patent
David et al.

(10) Patent No.: US 9,833,874 B2
(45) Date of Patent: *Dec. 5, 2017

(54) APPLYING DIMENSIONAL REDUCTION TO SPECTRAL DATA FROM POLISHING SUBSTRATES

(71) Applicant: Applied Materials, Inc., Santa Clara, CA (US)

(72) Inventors: Jeffrey Drue David, San Jose, CA (US); Boguslaw A. Swedek, Cupertino, CA (US); Benjamin Cherian, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/400,183

(22) Filed: Jan. 6, 2017

(65) Prior Publication Data

US 2017/0113320 A1    Apr. 27, 2017

Related U.S. Application Data

(63) Continuation of application No. 14/063,917, filed on Oct. 25, 2013, now Pat. No. 9,551,567.

(51) Int. Cl.
| | |
|---|---|
| *G01B 5/02* | (2006.01) |
| *B24B 49/00* | (2012.01) |
| *B24B 37/013* | (2012.01) |
| *B24B 49/12* | (2006.01) |
| *H01L 21/66* | (2006.01) |
| *H01L 21/306* | (2006.01) |

(52) U.S. Cl.
CPC ............ *B24B 37/013* (2013.01); *B24B 49/12* (2013.01); *H01L 21/30625* (2013.01); *H01L 22/26* (2013.01)

(58) Field of Classification Search
CPC ..... G01B 11/06; G01B 11/0625; H01L 22/12; H01L 22/20; H01L 22/26; B24B 49/12; B24B 37/013
USPC ........ 702/127, 155, 170, 172; 451/5, 6, 285, 451/287
See application file for complete search history.

(56) References Cited

U.S. PATENT DOCUMENTS

| | | | |
|---|---|---|---|
| 6,511,363 B2 | 1/2003 | Yamane et al. | |
| 6,939,198 B1 | 9/2005 | Swedek | |
| 7,764,377 B2 | 7/2010 | Benvegnu | |
| 9,551,567 B2 * | 1/2017 | David | ................. G01B 11/06 |
| 2007/0042681 A1 | 2/2007 | Benvegnu et al. | |

OTHER PUBLICATIONS

"Principal Component Analysis." Wikipedia. Last edited Oct. 25, 2013. Retrieved Oct. 25, 2013. Retrieved from the internet:URL<http://en.wikipedia.org/wiki/Principal_component_analysis>. 15 pages.

* cited by examiner

*Primary Examiner* — An Do
(74) *Attorney, Agent, or Firm* — Fish & Richardson P.C.

(57) ABSTRACT

A plurality of spectra reflected from one or more substrates at a plurality of different positions on the one or more substrates are represented in the form of a first matrix, and the first matrix is decomposed into products of at least two component matrixes of a first set of component matrixes. The dimensions of each of the at least two component matrixes is reduced to produce a second set of component matrixes containing the at least two matrixes with reduced dimensions.

15 Claims, 9 Drawing Sheets

APPLYING DIMENSIONAL REDUCTION TO SPECTRAL DATA FROM POLISHING SUBSTRATES

CROSS-REFERENCE TO RELATED APPLICATIONS

This application is a continuation of U.S. application Ser. No. 14/063,917, filed on Apr. 30, 2015, incorporated herein by reference.

TECHNICAL FIELD

The present disclosure relates to reducing noise in spectral data from polishing substrates, e.g., for controlling chemical mechanical polishing of the substrates.

BACKGROUND

An integrated circuit is typically formed on a substrate by the sequential deposition of conductive, semiconductive, or insulative layers on a silicon wafer. A variety of fabrication processes require planarization of a layer on the substrate. For example, for certain applications, e.g., polishing of a metal layer to form vias, plugs, and lines in the trenches of a patterned layer, an overlying layer is planarized until the top surface of a patterned layer is exposed. In other applications, e.g., planarization of a dielectric layer for photolithography, an overlying layer is polished until a desired thickness remains over the underlying layer.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. A polishing liquid, such as slurry with abrasive particles, is typically supplied to the surface of the polishing pad.

One problem in CMP is determining whether the polishing process is complete, i.e., whether a substrate layer has been planarized to a desired flatness or thickness, or when a desired amount of material has been removed. Variations in the initial thickness of the substrate layer, the slurry composition, the polishing pad condition, the relative speed between the polishing pad and the substrate, and the load on the substrate can cause variations in the material removal rate. These variations cause variations in the time needed to reach the polishing endpoint. Therefore, it may not be possible to determine the polishing endpoint merely as a function of polishing time.

In some systems, a substrate is optically measured in a stand-alone metrology station. However, such systems often have limited throughput. In some systems, a substrate is optically monitored in-situ during polishing, e.g., through a window in the polishing pad. However, existing optical monitoring techniques may not satisfy increasing demands of semiconductor device manufacturers.

SUMMARY

In one aspect, a machine based method comprises representing a plurality of spectra reflected from one or more substrates at a plurality of different positions on the one or more substrates in the form of a first matrix; decomposing, by one or more computers, the first matrix into products of at least two component matrixes of a first set of component matrixes; reducing dimensions of each of the at least two component matrixes to produce a second set of component matrixes containing the at least two matrixes with reduced dimensions; and generating, by the one or more computers, a second matrix by taking a product of the matrixes of the second set of component matrixes. Each spectrum is represented by a dataset arranged in a single row or a single column of the first matrix. The spectra is reflected when an outer layer of the one or more substrates has substantially the same thickness at the plurality of positions. The second matrix has the same dimensions as the first matrix. Each single row or each single column of the second matrix comprises a modified dataset representing a modified spectrum corresponding to the spectrum represented by a respective single row or single column of the first matrix.

In another aspect, a computer program product resides on a computer readable medium, and the computer program product comprises instructions for causing a processor to: represent a plurality of spectra reflected from one or more substrates at a plurality of different positions on the one or more substrates in the form of a first matrix; decompose, by one or more computers, the first matrix into products of at least two component matrixes of a first set of component matrixes; reduce dimensions of each of the at least two component matrixes to produce a second set of component matrixes containing the at least two matrixes with reduced dimensions; and generate, by the one or more computers, a second matrix by taking a product of the matrixes of the second set of component matrixes. Each spectrum is represented by a dataset arranged in a single row or a single column of the first matrix. The spectra are reflected when an outer layer of the one or more substrates has substantially the same thickness at the plurality of positions. The second matrix has the same dimensions as the first matrix. Each single row or each single column of the second matrix comprises a modified dataset representing a modified spectrum corresponding to the spectrum represented by a respective single row or single column of the first matrix.

In another aspect, a computer system comprises a processor; a memory; and a storage device that stores a program for execution by the processor using the memory. The program comprises instructions configured to cause the processor to: represent a plurality of spectra reflected from one or more substrates at a plurality of different positions on the one or more substrates in the form of a first matrix; decompose, by one or more computers, the first matrix into products of at least two component matrixes of a first set of component matrixes; reduce dimensions of each of the at least two component matrixes to produce a second set of component matrixes containing the at least two matrixes with reduced dimensions; and generate, by the one or more computers, a second matrix by taking a product of the matrixes of the second set of component matrixes. Each spectrum is represented by a dataset arranged in a single row or a single column of the first matrix. The spectra are reflected when an outer layer of the one or more substrates has substantially the same thickness at the plurality of positions. The second matrix has the same dimensions as the first matrix. Each single row or each single column of the second matrix comprises a modified dataset representing a modified spectrum corresponding to the spectrum represented by a respective single row or single column of the first matrix.

Certain implementations of the methods, the systems, and/or the computer program products may include one or more of the following features. A characterizing value is generated, by the one or more computers, based on the second matrix. The characterizing value is associated with a property of the one or more substrates. The characterizing value is the thickness of the outermost layer on the one or more substrates. Spectra reflected from one or more substrates at locations where the outer layer of the one or more substrates has different thicknesses are grouped into different groups. Each different group of spectra is to be represented by a first matrix. Decomposing the first matrix comprises applying singular value decomposition, CUR matrix approximation, and/or principal component analysis. Reducing dimensions of each of the at least two component matrixes comprises truncating one or more columns and/or one or more rows of each of the at least two component matrixes. One of the at least two component matrixes is a diagonal matrix. The dimensions are reduced based on predetermined criteria. The predetermined criteria comprise truncating the one or more columns and/or rows of the diagonal matrix that correspond to one or more nonzero matrix elements having a value smaller than a predetermined percentage of values of all nonzero matrix elements of the diagonal matrix. The predetermined percentage is % or higher. The dimensions are reduced based on predetermined criteria. The predetermined criteria comprise the difference between the first and second matrixes being smaller than a predetermined value. Reducing dimensions of each of the at least two component matrixes comprises replacing all non-zero values of one or more columns or rows of matrix elements with zeros. One of the at least two component matrixes is a diagonal matrix and reducing dimensions of the diagonal matrix comprises replacing non-zero values of one or more diagonal matrix elements with zeros. The spectra are measured with an in-line monitoring system before polishing of the substrate. The spectra are measured with an in-situ monitoring system during polishing of the substrate. A polishing endpoint is determined for the substrate based on the characterizing value.

Certain implementations may include one or more of the following advantages. Noise in a spectrum can be reduced. Wafer thicknesses can be measured relatively precisely so that endpoints of polishing can be determined at a high precision. Wafer-to-wafer thickness non-uniformity (WTWNU and WTWNU) may be reduced, and reliability of the endpoint system to detect a desired polishing endpoint may be improved.

DETAILED DESCRIPTION

One optical monitoring technique for controlling a polishing operation is to measure a spectrum of light reflected from a substrate, either in-situ during polishing or at an in-line metrology station, and fit a function, e.g., an optical model, to the measured spectra. Another technique is to compare the measured spectrum to a plurality of reference spectra from a library, and identify a best-matching reference spectrum.

Either fitting of the optical model or identification of the best matching reference spectrum is used to generate a characterizing value, e.g., the thickness of the outermost layer. For the fitting, the thickness can be treated as an input parameter of the optical model, and the fitting process generates a value for the thickness. For finding a match, the thickness value associated with the reference spectrum can be identified.

Chemical mechanical polishing can be used to planarize the substrate until a predetermined thickness of the first layer is removed, a predetermined thickness of the first layer remains, or until the second layer is exposed.

Generally, the measured spectrum contains noise data that may affect the precision of the characterizing value or the thickness measurement. The methods and systems of this disclosure reduce the noise in the spectrum to improve the precision of thickness measurement, although precision of measurement of other properties can also be improved. The precisely determined thickness can be used to determine the endpoint of the chemical mechanical polishing and improve the uniformity of the wafer thickness.

Figure 1:
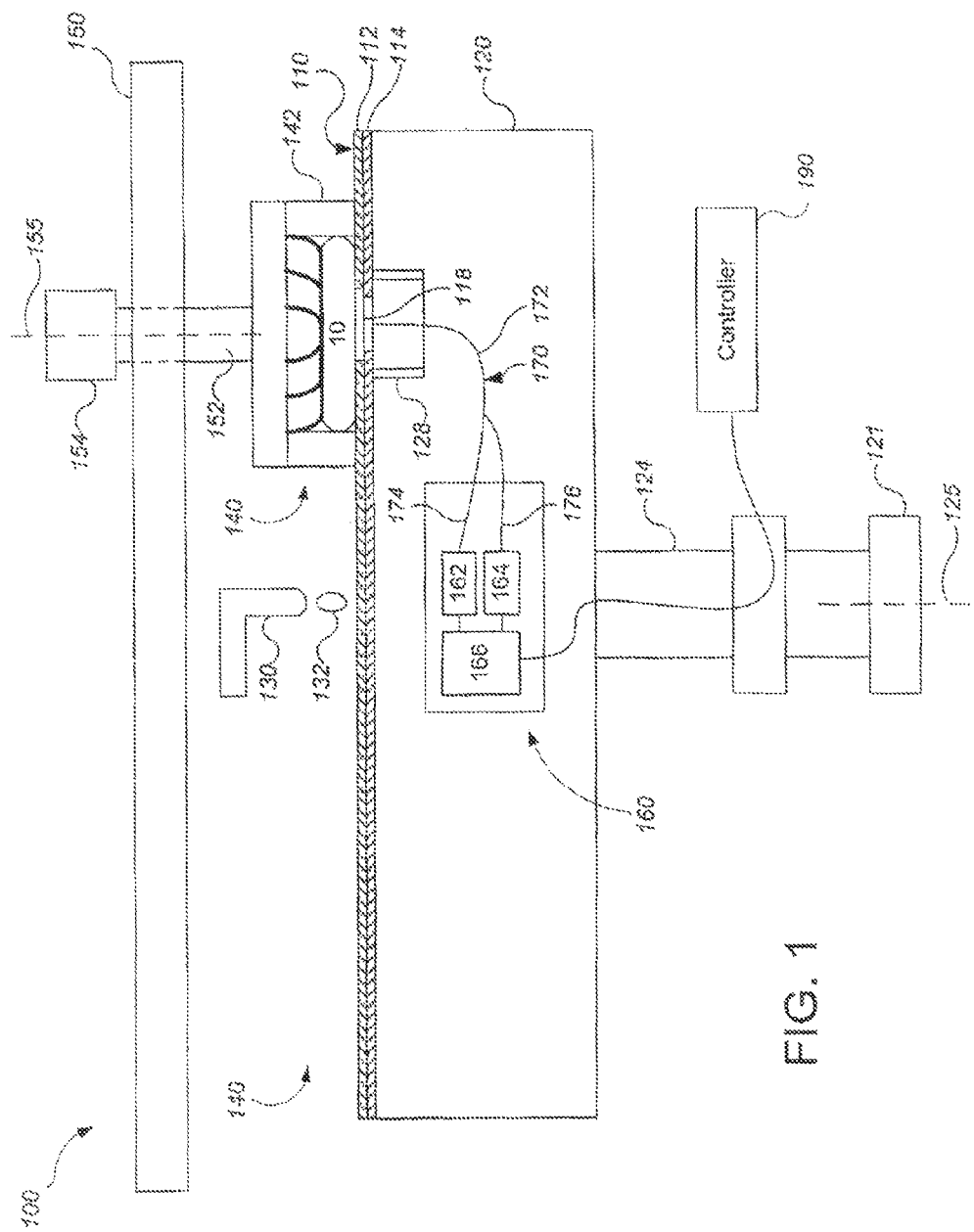
FIG. 1 illustrates a schematic cross-sectional view of an example of a polishing station.

FIG. 1 illustrates an example of a polishing apparatus 100. The polishing apparatus 100 includes a rotatable disk-shaped platen 120 on which a polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 and a softer backing layer 114.

The polishing apparatus 100 can include a port 130 to dispense polishing liquid 132, such as a slurry, onto the polishing pad 110. The polishing apparatus can also include a polishing pad conditioner to abrade the polishing pad 110 to maintain the polishing pad 110 in a consistent abrasive state.

The polishing apparatus 100 includes one or more carrier heads 140. Each carrier head 140 is operable to hold a substrate 10, such as a wafer, against the polishing pad 110. Each carrier head 140 can have independent control of the polishing parameters, for example pressure, associated with each respective substrate. Each carrier head includes a retaining ring 142 to hold the substrate 10 in position on the polishing pad 110.

Each carrier head 140 is suspended from a support structure 150, e.g., a carousel or a track, and is connected by a drive shaft 152 to a carrier head rotation motor 154 so that the carrier head can rotate about an axis 155. Optionally each carrier head 140 can oscillate laterally, e.g., on sliders on the carousel 150; by rotational oscillation of the carousel itself, or by motion of a carriage 108 that supports the carrier head 140 along the track.

In operation, the platen is rotated about its central axis 125, and each carrier head is rotated about its central axis 155 and translated laterally across the top surface of the polishing pad.

While only one carrier head 140 is shown, more carrier heads can be provided to hold additional substrates so that the surface area of polishing pad 110 may be used efficiently. Thus, the number of carrier head assemblies adapted to hold substrates for a simultaneous polishing process can be based, at least in part, on the surface area of the polishing pad 110.

In some implementations, the polishing apparatus includes an in-situ optical monitoring system 160, e.g., a spectrographic monitoring system, which can be used to measure a spectrum of reflected light from a substrate undergoing polishing. An optical access through the polishing pad is provided by including an aperture (i.e., a hole that runs through the pad) or a solid window 118.

Figure 2:
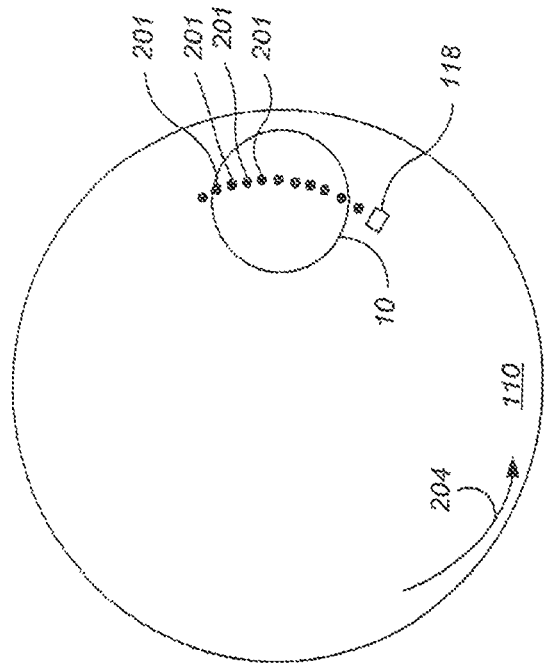
FIG. 2 illustrates a schematic top view of a substrate having multiple zones.

Referring to FIG. 2, if the window 118 is installed in the platen, due to the rotation of the platen (shown by arrow 204), as the window 118 travels below a carrier head, the optical monitoring system making spectra measurements at a sampling frequency will cause the spectra measurements to be taken at locations 201 in an arc that traverses the substrate 10.

Figure 3:
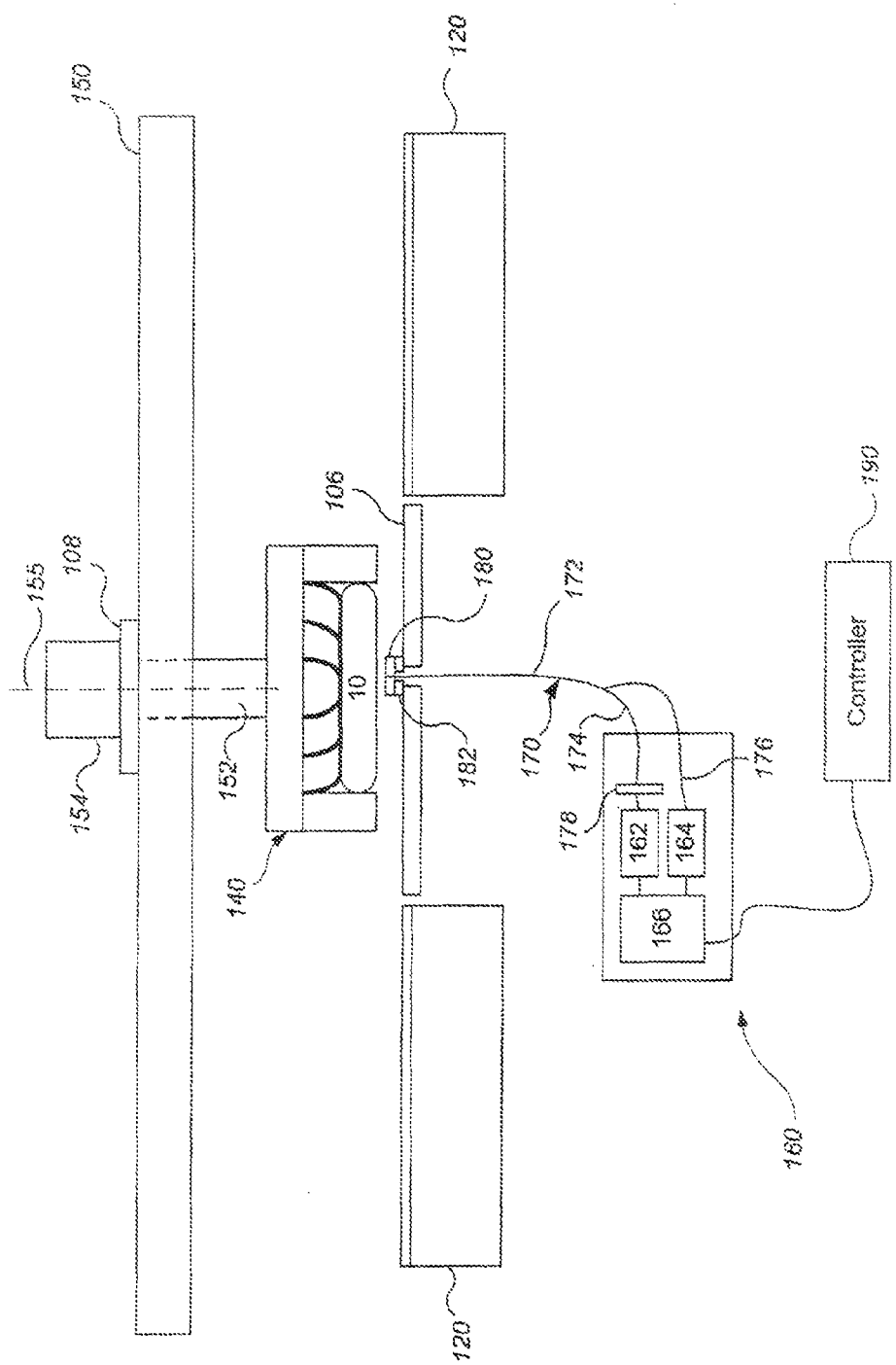
FIG. 3 illustrates a schematic cross-sectional view of an example of an in-line monitoring station.

In some implementation, illustrated in FIG. 3, the polishing apparatus includes an in-sequence optical monitoring system 160 having a probe 180 positioned between two polishing stations or between a polishing station and a transfer station. The probe 180 of the in-sequence monitoring system 160 can be supported on a platform 106, and can be positioned on the path of the carrier head.

The probe 180 can include a mechanism to adjust its vertical height relative to the top surface of the platform 106. In some implementations, the probe 180 is supported on an actuator system 182 that is configured to move the probe 180 laterally in a plane parallel to the plane of the track. The actuator system 182 can be an XY actuator system that includes two independent linear actuators to move probe 180 independently along two orthogonal axes. In some implementations, there is no actuator system 182, and the probe 180 remains stationary (relative to the platform 106) while the carrier head 140 moves to cause the spot measured by the probe 180 to traverse a path on the substrate.

Figure 4:
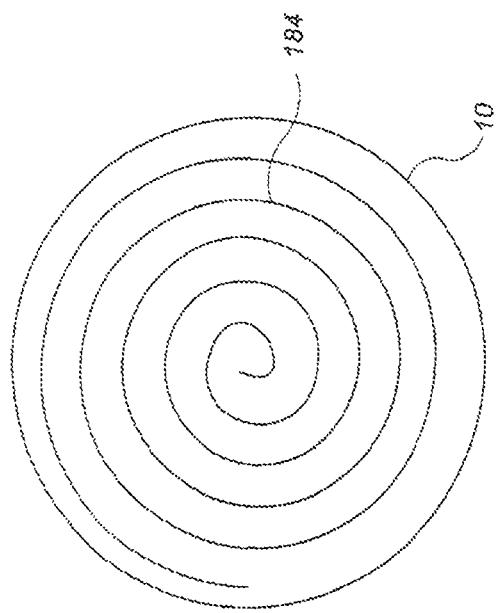
FIG. 4 illustrates a top view of a polishing pad and shows locations where in-situ measurements are taken on a substrate.

Referring to FIG. 4, the probe 180 can traverse a path 184 over the substrate while the monitoring system take a sequence of spectra measurements, so that a plurality of spectra are measured at different positions on the substrate. By proper selection of the path and the rate of spectra measurement, the measurements can be made at a substantially uniform density over the wafer. Alternatively, more measurements can be made near the edge of the substrate.

In the specific implementation shown in FIG. 4, the carrier head 126 can rotate while the carriage 108 causes the center of the substrate to move outwardly from the probe 180, which causes the spot 184 measured by the probe 180 to traverse a spiral path 184 on the substrate 10. However, other combinations of motion can cause the probe to traverse other paths, e.g., a series of concentric circles or a series of arcuate segments passing through the center of the substrate 10. Moreover, if the monitoring station includes an XY actuator system, the measurement spot 184 can traverse a path with a plurality of evenly spaced parallel line segments. This permits the optical metrology system 160 to take measurements that are spaced in a rectangular pattern over the substrate.

Returning to FIGS. 1 and 3, in either the in-situ or in-sequence embodiments, the optical monitoring system 160 can include a light source 162, a light detector 164, and circuitry 166 for sending and receiving signals between a remote controller 190, e.g., a computer, and the light source 162 and light detector 164. One or more optical fibers can be used to transmit the light from the light source 162 to the optical access in the polishing pad, and to transmit light reflected from the substrate 10 to the detector 164. For example, a bifurcated optical fiber 170 can be used to transmit the light from the light source 162 to the substrate 10 and back to the detector 164. The bifurcated optical fiber an include a trunk 172 positioned in proximity to the optical access, and two branches 174 and 176 connected to the light source 162 and detector 164, respectively. The probe 180 can include the trunk end of the bifurcated optical fiber.

The light source 162 can be operable to emit white light. In one implementation, the white light emitted includes light having wavelengths of 200-800 nanometers. In some implementations, the light source 162 generates unpolarized light. In some implementations, a polarization filter 178 (illustrated in FIG. 3, although it can be used in the in-situ system of FIG. 1) can be positioned between the light source 162 and the substrate 10. A suitable light source is a xenon lamp or a xenon mercury lamp.

Figure 5A:
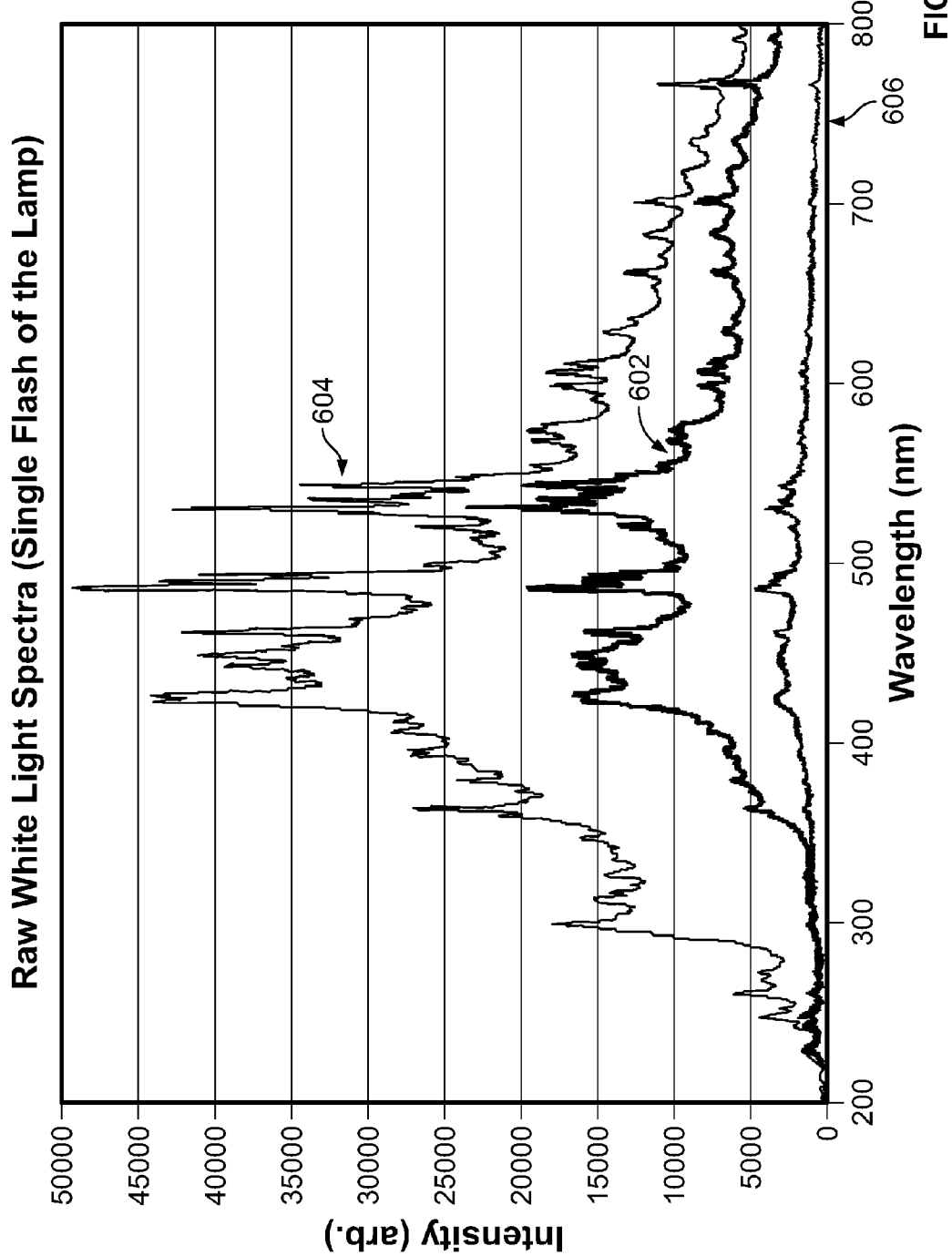
FIG. 5A illustrates a measured spectrum from the optical monitoring system.

The light detector 164 can be a spectrometer. A spectrometer is an optical instrument for measuring intensity of light over a portion of the electromagnetic spectrum. A suitable spectrometer is a grating spectrometer. Typical output for a spectrometer is the intensity of the light as a function of wavelength (or frequency). In some examples, for each spectrum, the spectrometer outputs the intensities of the light at 200-500, e.g., 301, different wavelengths. FIG. 5A shows an example of spectra reflected from the substrate by applying a single flash of light from a light source to the substrate. In particular, spectrum 602 is measured from light reflected from a product substrate. Spectrum 604 is measured from light reflected from a base silicon substrate (which is a wafer that has only a silicon layer). Spectrum 606 is from light received by the probe 180 when there is no substrate situated over the probe 180. Under this condition, referred to in the present specification as a dark condition, the received light is typically ambient light.

Figure 5B:
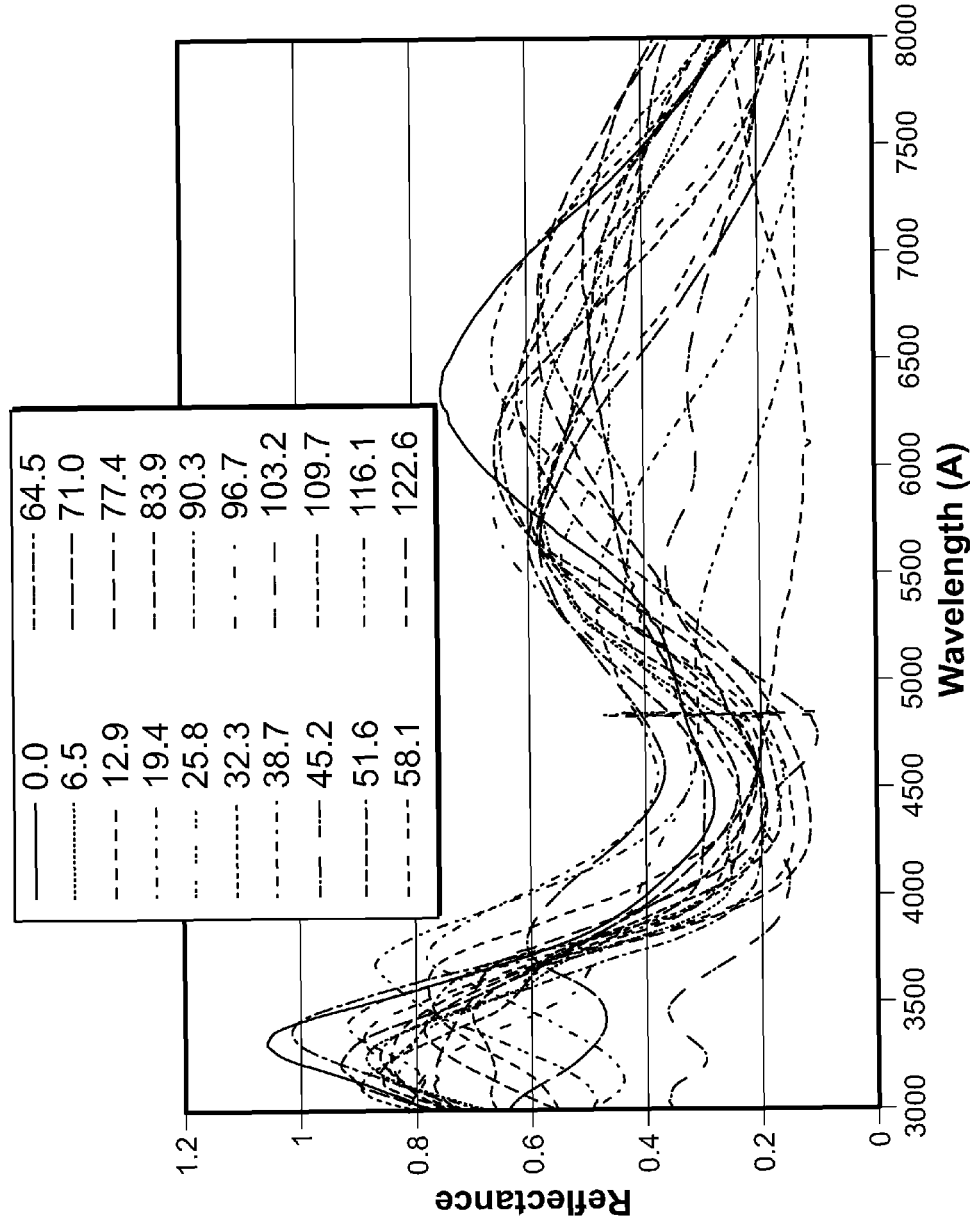
FIG. 5B illustrates spectrum evolution as the thickness of a substrate changes during polishing.

The computing device can process the above described signal to determine an endpoint of a polishing step. Without being limited to any particular theory, the spectra of light reflected from the substrate 10 evolve as polishing progresses. FIG. 5B provides an example of the evolution as polishing of a film of interest progresses. The different lines of spectrum represent different times in the polishing. As can be seen, properties of the spectrum of the reflected light changes as a thickness of the film changes, and particular spectrums are exhibited by particular thicknesses of the film. The computing device can execute logic that determines, based on one or more of the spectra, when an endpoint has been reached. The one or more spectra on which an endpoint determination is based can include a target spectrum, a reference spectrum, or both.

As noted above, the light source 162 and light detector 164 can be connected to a computing device, e.g., the controller 190, operable to control their operation and receive their signals. The computing device can include a microprocessor situated near the polishing apparatus, e.g., a programmable computer. In operation, the controller 190 can receive, for example, a signal that carries information describing a spectrum of the light received by the light detector for a particular flash of the light source or time frame of the detector.

Figure 5C:
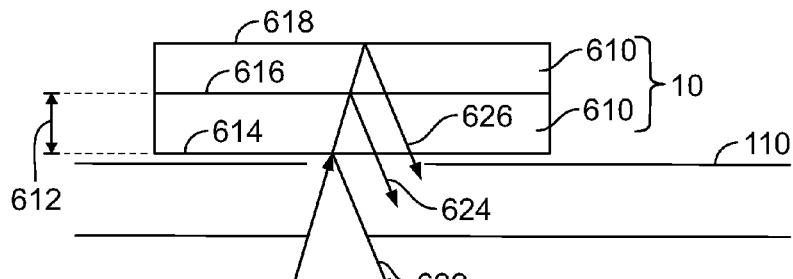
FIG. 5C illustrates a schematic cross-sectional view of light reflections and interferences in optical monitoring.

Referring to FIGS. 5A and 5C, the spectra 602 contains information about a thickness 612 of an outer layer 650 of the substrate 10. During polishing, the outer layer directly contacts the polishing pad 110 and its outer surface 614 is polished. The substrate 10 may have one or more additional layers 610 at the back of the outer layer 650. When a flash of white light 620 is applied to the substrate 10, part of the white light 620 reflects (622) at the outer surface 614 of the outer layer 650. Another part of the white light 620 penetrates the outer surface 614 and is at least partially reflected (624) by an inner surface 616 of the outer layer 650. Part of the light 620 may further penetrate the inner surface 624 and be at least partially reflected by the one or more layers 610 or a surface 618 at the back of the substrate 10.

Without wishing to be bound by any particular theory, it is believed that the spectra data contains information about the thickness(es) of one or more layers of the substrate 10. The values of the spectra, i.e., the light intensities may also be affected by the optical properties of the layers, such as index of refractions of the substrate materials, the absorption coefficients of the substrate materials, and others. It is also believed that the light intensity in the spectrum 604 also contains information representing interferences between reflections, such as those between the reflections 624, 626 or the reflections 622, 626. The light intensity data may also contain other noise data that originate from sources, such as variation in structural dimensions of the device (e.g., critical dimensions, sidewall angle, etc.), pad window variations (e.g., changing absorption in the shorter wavelengths), other process influences (e.g., slurry pooling).

Figure 5D:
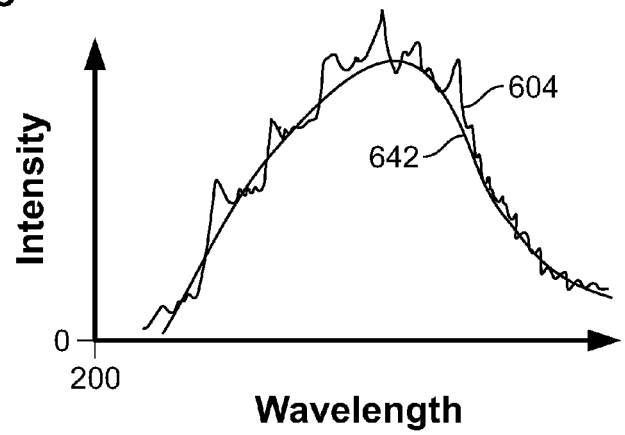
FIG. 5D illustrates a schematic plot of a part of a measured spectrum and a modified spectrum with reduced noise.
Figure 5E:
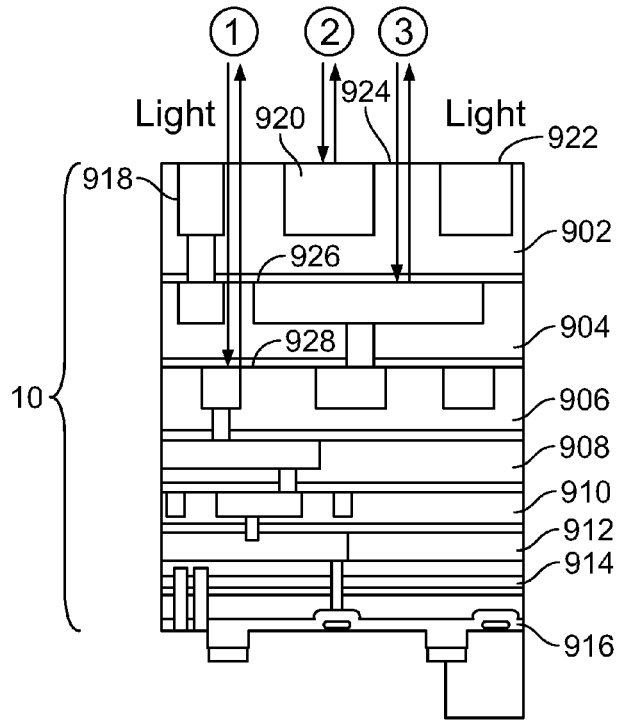
FIG. 5E illustrates another schematic cross-sectional view of light reflections and interferences in optical monitoring.
Figure 5F:
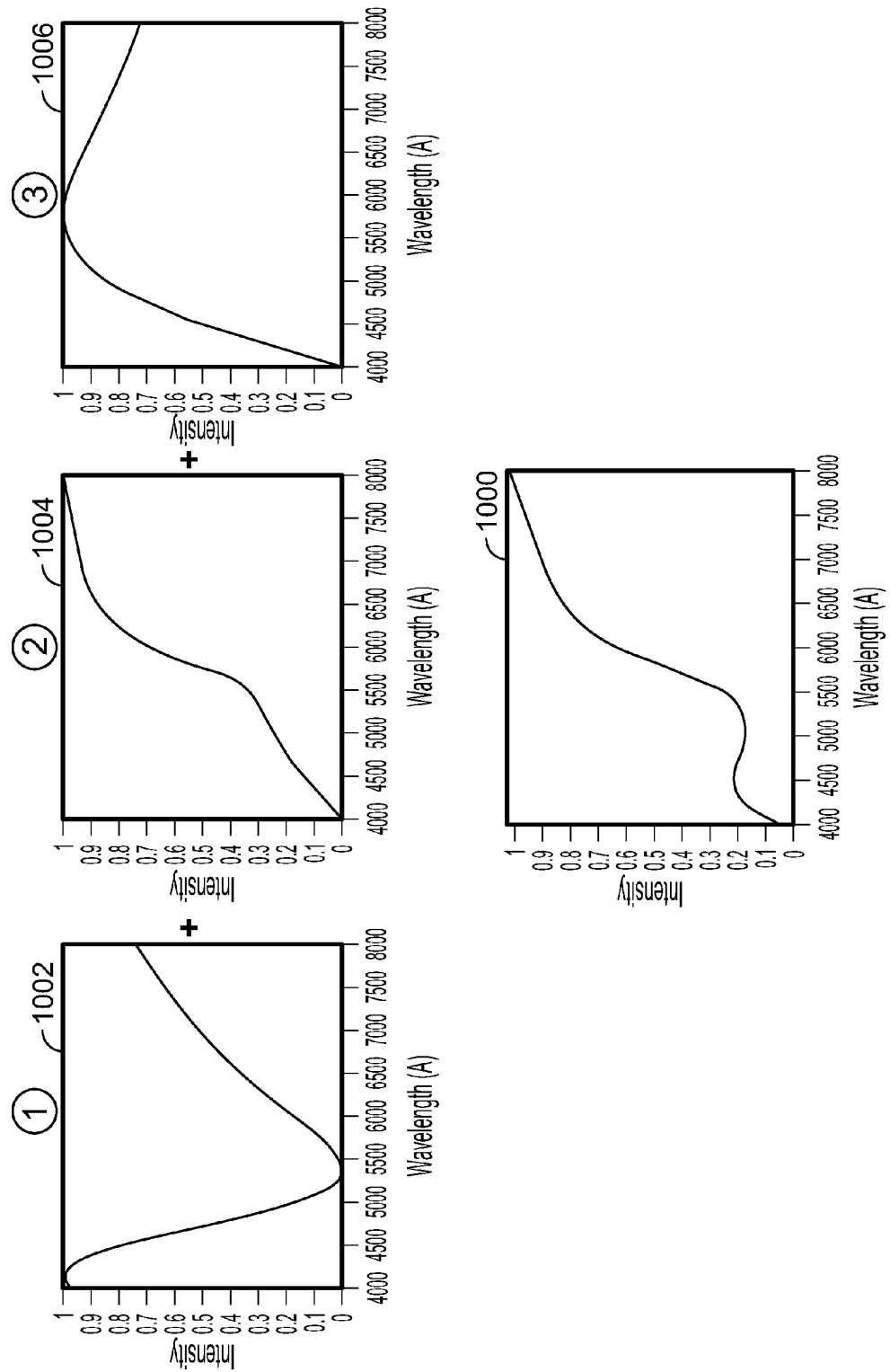
FIG. 5F shows plots of an overall spectrum measured from the light reflections and interferences of FIG. 5E, and of calculated spectra for each individual light reflection and interference.
Figure 5G:
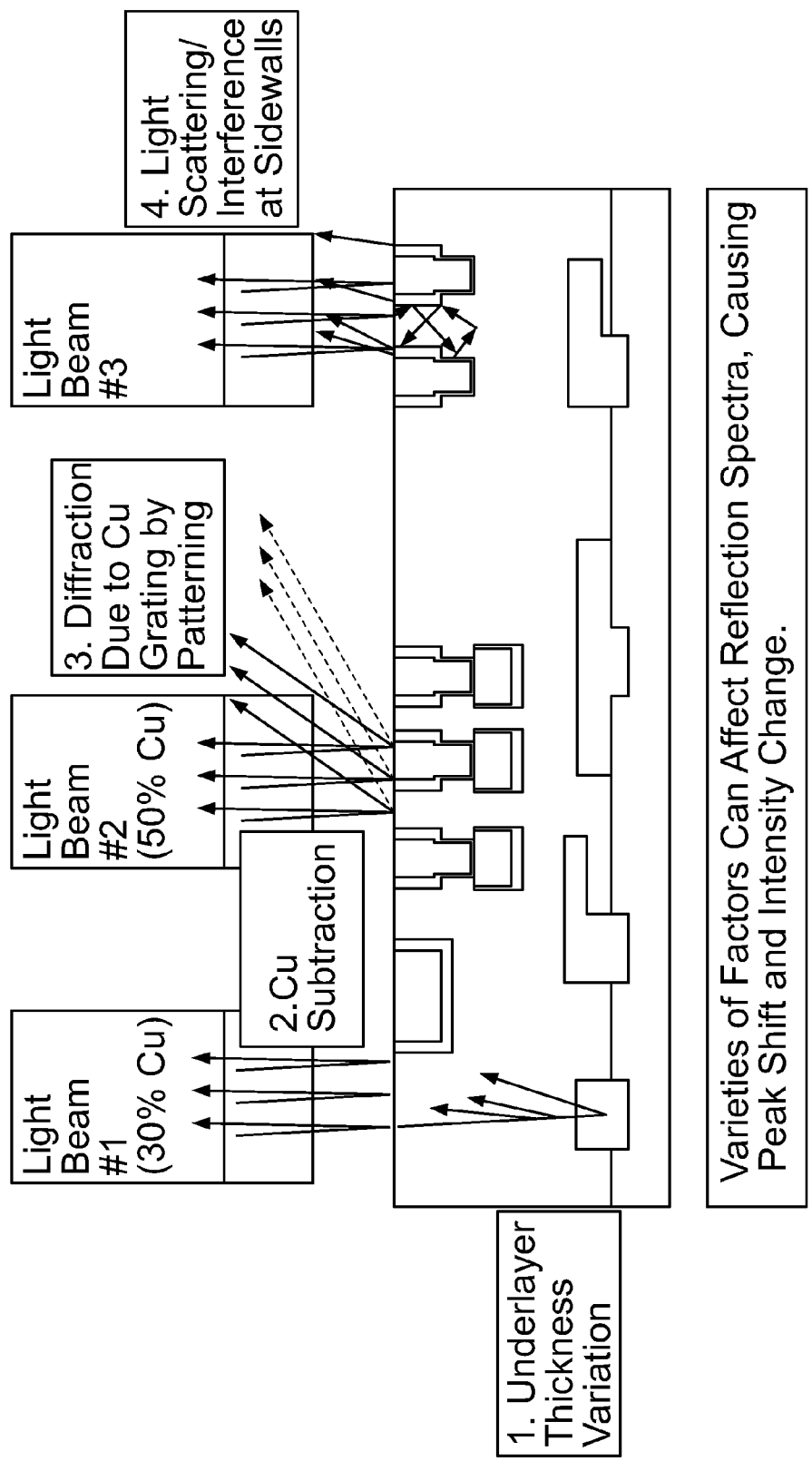
FIG. 5G shows a variety of factors that affect reflection spectra and in connection with layers and features of a substrate.

As an example, referring to FIG. 5E and 5F, an example substrate 10 includes a stack of layers 902, 904, 906, 908, 910, 912, 914, 916, with one or more layers containing one or more structural features 918, 920, 922, etc. When a flash of light is applied to an outer surface 924 of the substrate 10, the light penetrates one or more layers 902, 904 and is reflected from multiple surfaces 924, 926, 928. The measured spectra 1000 shown in FIG. 5F can be a weighted combination of respective spectra 1002, 1004, 1006 associated with the different reflections from the different surfaces. As shown in FIG. 5G, the factors that affect the measured spectra may include thickness variations of the layers in the substrate, the substrate material (which is Cu in this example), diffractions due to Cu grating by patterning, light scattering/interference at sidewalls, etc.

Reducing the noise of the spectrum 604 can allow the thickness 612 of the outer layer 650 to be determined at a higher precision than the spectrum 604 that contains the noise data. As an example, FIG. 5D shows a spectrum 604 recording the output of the spectrometer. After the noise is reduced, the modified spectrum 642 shows a relatively smooth curve and retains the largest component of the spectrum 604 representing the thickness of the outer layer 650.

Alternative to the plots shown in FIGS. 5A, 5B, and 5D, a spectrum measured at one location of the substrate 10 can also be represented by a matrix: $B=(i_1, i_2, \ldots, i_n)$, where $i_j$ represents the light intensity at the jth wavelength of a total of n wavelengths. In an example, n can be 200-500, or 301.

Referring again to FIG. 2, when multiple spectra are measured at multiple locations 201 of the substrate during one rotation of the polishing pad, each spectrum can be similarly presented by a matrix B. In some situations, the thicknesses measured at the multiple locations 201 within the same rotation are substantially the same. For example, the thickness variation among the different locations measured within the same rotation would be within 500 Angstroms. Suppose that m locations are measured, the m matrixes B can be combined to form the following matrix:

$$A = \begin{pmatrix} i_{11} & i_{12} & \cdots & i_{1n} \\ i_{21} & i_{22} & \cdots & i_{2n} \\ \vdots & \vdots & \cdots & \vdots \\ i_{m1} & i_{m2} & \cdots & i_{mn} \end{pmatrix},$$

where $i_{jk}$ represents the light intensity at the kth wavelength of the jth location. Each row of the matrix A represents a spectrum for calculating a thickness of the substrate at one location, while all thicknesses represented by the different spectra are substantially the same. Alternatively, data of a spectrum can also be arranged in a single column.

The noise data contained in the spectra represented by the matrix A can be reduced using singular value decomposition (SVD), CUR matrix approximation, or principal component analysis, each followed by dimension reductions. These techniques can identify similar components in a dataset, e.g., thickness in this example, while filtering out noise components in the dataset, e.g., due to variations in the thickness of an underlying layer. The techniques can be used in the in-situ systems or the in-line systems. The techniques can also be used with other datasets, e.g., data stored in a data library or database.

Singular Value Decomposition

The decomposition can be mathematically expressed as follows:

$$A = U\Sigma V^T,$$

where U and V are orthonormal matrixes, $U^T U = I$, and $V^T V = I$, having m by p dimensions and n by p dimensions, respectively, and $\Sigma$ is diagonal and has p by p dimensions. Without wishing to be bound by theory, it is believed that each column of the U matrix and each row of the $V^T$ matrix represent a concept, such as different degrees, or strengths, of interferences between different reflection light in the thickness measurement. It is also believed that each element of the U matrix represents location-to-concept similarities, the $\Sigma$ matrix represents strength of each concept, and each element of the V matrix represents wavelength-to-concept similarities.

The U matrix can be written as:

$$U = (u_1, u_2, \ldots, u_p),$$

where $$u_i = \begin{pmatrix} u_{1i} \\ u_{2i} \\ \vdots \\ u_{mi} \end{pmatrix},$$

i.e., $U = \begin{bmatrix} u_{11} & \cdots & u_{1p} \\ \vdots & \ddots & \vdots \\ u_{m1} & \cdots & u_{mp} \end{bmatrix},$ the V matrix can be written as:

$$V = (v_1, v_2, \ldots, v_p),$$

where $$v_i = \begin{pmatrix} v_{1i} \\ v_{2i} \\ \vdots \\ v_{ni} \end{pmatrix},$$

i.e., $V^T = \begin{bmatrix} v_{11} & \cdots & v_{n1} \\ \vdots & \ddots & \vdots \\ v_{1p} & \cdots & v_{np} \end{bmatrix}$, and
the $\Sigma$ matrix can be written as:

$$\sum = (\sigma_1, \sigma_2, \ldots, \sigma_p),$$

where $$\sigma_i = \begin{pmatrix} 0 \\ \vdots \\ \sigma_{ii} \\ \vdots \\ 0 \end{pmatrix}.$$

For every matrix A, the decomposition is unique Also, the $\Sigma$ matrix is arranged such that $\sigma_{11} \geq \sigma_{22} \geq \ldots \geq \sigma_{pp}$. Accordingly, the matrix A can be written as:

$$A = \sigma_1 u_1 v_1^T + \sigma_2 u_2 v_2^T + \ldots + \sigma_p u_p v_p^T$$

Following the decomposition, to reduce the noise data in the A matrix, the dimensions of the U, $\Sigma$, and $V^T$ matrixes are effectively reduced. In some implementations, the values of $\sigma_{ii}$ decreases as i increases, such that:

$$\Sigma_{i>t}|\sigma_{ii}|^2 < r^* \Sigma_i |\sigma_{ii}|^2,$$

where t is an integer between 1 and p, and r is a predetermined percentage, e.g., 60%, 70%, 80%, 90%, or higher. In such implementations, those matrix element(s) $\sigma_{ii}$ that are part of the small values $\Sigma_{i>t}|\sigma_{ii}|^2$ limit the values or significance of the corresponding term $\Sigma_{i>t} \sigma_i u_i v_i^T$ in the matrix A, such that these terms only correspond to a small fraction, e.g., less than 40%, less than 30%, less than 20%, less than 10%, or less, of the matrix A. Such a small fraction can correspond to the undesirable noise in the spectra. Accordingly, these terms $\Sigma_{i>t} \sigma_i u_i v_i^T$ can be discarded.

In some implementations, for simplicity, a predetermined number of non-zero diagonal elements of the $\Sigma$ matrix is eliminated or selected to remain in the matrix. For example, two diagonal elements having the smallest values are eliminated from the $\Sigma$ matrix, or two diagonal elements having the largest values are chosen to remain in the matrix while all other diagonal elements are eliminated. Those rows and columns of the matrix that correspond to the eliminated diagonal elements can be eliminated to reduce the dimensions of the matrix. Alternatively, the values of the diagonal elements to be eliminated can be replaced with zero.

Effectively, the U matrix is reduced to have m by t dimensions, the V matrix is reduced to have n by t dimensions, and the $\Sigma$ matrix is reduced to have t by t dimensions. This reduction in dimension could be accomplished by actually removing rows and column from the matrices U and V, respectively, or by simply setting the appropriate diagonal values in the $\Sigma$ matrix to zero. The matrix A is reconstructed by the matrixes with reduced dimensions to be approximately:

$$A \approx \sigma_1 u_1 v_1^T + \sigma_2 u_2 v_2^T + \ldots + \sigma_t u_t v_t^T,$$

where the large components of the matrix A remains in the reconstructed matrix A. Each row of the reconstructed matrix A represents a modified spectrum that corresponds to a measured spectrum in the original matrix A. Relative to the measured spectrum, the modified spectrum contains a reduced amount of noise and can be used to calculate the thickness of the outermost layer of the substrate. Such calculated thicknesses are more precise than thicknesses calculated based on the original matrix A, because of the noise reduction.

Alternative or in addition to the criteria for dimension reduction discussed above, the difference between the original and the reconstructed matrixes can also be used. For example, the difference, $\|\text{original A} - \text{reconstructed A}\|^2$ is chosen to be smaller than a predetermined value so that the dimension reduction does not reduce the data in addition to the noise data, e.g., the data needed for calculating the thickness.

CUR Matrix Approximation

In some implementations, alternative to the singular value decomposition, CUR matrix approximation can be used to decompose the original A matrix. The method can be selected based the properties of the A matrix, for example, how sparse the A matrix is, etc. Sometimes the CUR matrix approximation is chosen when the A matrix is relatively sparse, although the singular value decomposition can also be used.

Principal Component Analysis

Another alternative decomposition method is principal component analysis (PCA). The PCA performs an orthogonal linear transformation that transforms the data in the A matrix (m x n dimensions) to a new coordinate system such that the greatest variance by any projection of the data comes to lie on the first coordinate (called the first principal component), the second greatest variance on the second coordinate, and so on. Mathematically, the transformation is defined by a set of p-dimensional vectors of weights $w_k = (w_{k1}, w_{k2}, \ldots, w_{kp})$ that map each m-dimensional row vector $A_i$ of the matrix A to a new vector of principal component scores $t_i = (t_{k1}, t_{k2}, \ldots, t_{ip})$, where $t_{ki}$ is:

$$t_{ki} = A_i \cdot w_k.$$

Each vector $w_k$ is constrained to be a unit vector. As a result, the individual variables of $t_i$ inherits the maximum possible variance from the matrix A. The decomposition of the matrix A can be written as:

$$T = AW,$$

where W is a n-by-p matrix whose columns are the eigenvectors of $A^T A$. To reduce the noise data in the matrix A, the dimensions of the T and W matrixes can be reduced. In particular, instead of p principal components, a total of L principal components, with L being an integer between 0 and p, can be kept such that the dimensions of the T matrix is reduced to m×L, and the dimensions of the W matrix is reduced to n×L. Similar to the singular value decomposition, a matrix A can be reconstructed based on the T and W matrixes with reduced dimensions. The constructed matrix A can have all the major components that represent the thickness of the substrate, while a large portion of the noise data is removed as compared to the original matrix A.

The PCA transformation can be mathematically associated with the previously discussed singular value decomposition, and the T matrix can be expressed as:

$$T = U\Sigma.$$

Details of the PCA are also discussed in Functional Data Analysis by James Ramsay and B. W. Silverman (Springer; 2nd edition (Jul 1, 2005)), and Principal Component Analysis by I. T. Jolliffe (Springer; 2nd edition (Oct. 2, 2002)), the entire content of which is incorporated herein by reference.

The noise reduction processes discussed above can be used in processing measured spectra before the data is used in calculating substrate thicknesses in an in-situ system or an in-line system. The noise reduction processes can be performed in real time during the polishing or be applied to data from a database or a data library that has collected the data.

Figure 6:
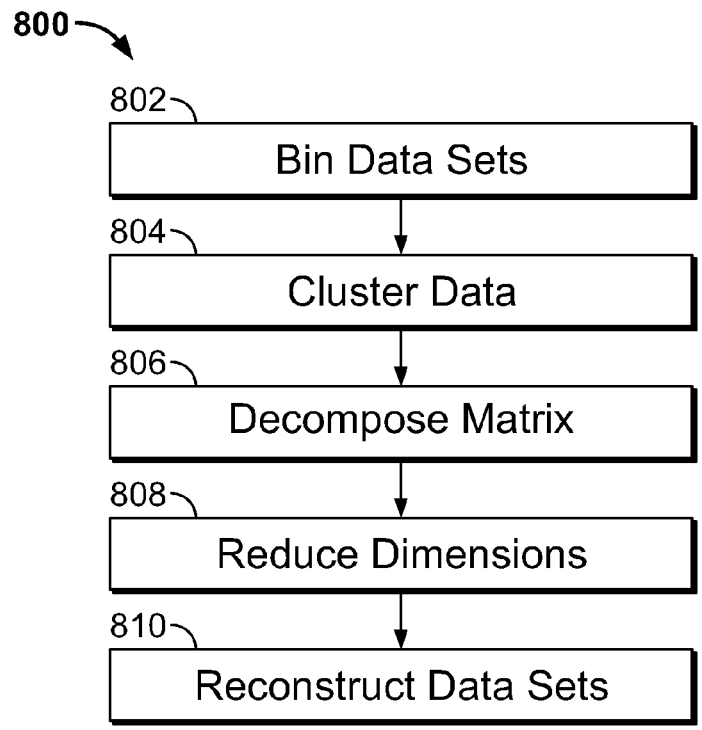
FIG. 6 is a flow diagram of an example process that reduces noise in measured spectra.

An example process 800 is shown in FIG. 6. After the spectra, e.g., light intensity data which typically is set for one thickness measurement, or other data, are collected, or are made available, e.g., through links to a database or data library, datasets that contain information for a similar, e.g., the same, thickness are binned (802) together. The datasets binned together can be data for one wafer, e.g., collected for a given rotation of the platen, or data for multiple wafers, e.g., from a data library, that is associated with the similar or the same thickness. The binned data can be stored in the form of a matrix, like the matrix A shown above. Optionally, the binned data is further clustered (804) based on different types of spectra for a given rotation and/or a given thickness value. One technique for the clustering is k-means clustering, the details of which are discussed in U.S. Patent Publication No. 2015/0120242, the entire content of which is incorporated herein by reference. The clustering may further refine the binned datasets to facilitate precise thickness calculations. The clustered data for a given thickness value can also be stored in the form of a matrix, such as the matrix A above. The matrix is then decomposed (806), using singular value decomposition, principal component analysis, or CUR matrix approximation, into component matrixes (e.g., U, $\Sigma$, and T matrixes in SVD, or T and W matrixes in PCA). The dimensions of the component matrixes are then reduced (808). The reduction can be done automatically based on predetermined criteria. For example, in the example of SVD, the predetermined criteria can be whether a percentage of the values of the matrix elements, starting with the one having the highest index, in the $\Sigma$ matrix is lower than a threshold percentage. An algorithm can be implemented such that when the percentage of the values of those elements is lower than the threshold percentage, which can be predetermined, columns and rows corresponding to those matrix elements are truncated from the matrix. The dimensions of U and V matrixes are reduced according to the reduction in the $\Sigma$ matrix. Other criteria for dimension reduction can also be used. A user may be enabled to enter or adjust the predetermined criteria, e.g., through a user interface. In some implementations, the dimension reduction can be manually performed by a user. The datasets, or the spectra, are reconstructed (810) using the matrixes with the reduced dimensions. The reconstructed datasets or spectra contain a reduced amount of noise as compared to the initial datasets or spectra.

Referring again to FIG. 1, for each reconstructed dataset or spectrum, the controller 190 can calculate a characterizing value. The characterizing value is typically the thickness of the substrate 10, e.g., the thickness 612 of FIG. 5C, but can be a related characteristic such as thickness removed. In addition, although not discussed in detail above, the characterizing value can be a physical property other than thickness, e.g., metal line resistance. In addition, the characterizing value can be a more generic representation of the progress of the substrate through the polishing process, e.g., an index value representing the time or number of platen rotations at which the spectrum would be expected to be observed in a polishing process that follows a predetermined progress. Details of techniques for calculating the characterizing value are discussed in U.S. Pat. No. 7,764,377 and U.S. Patent Publication No. 2014/0242878, the entire content of which is incorporated here by reference.

Figure 7:
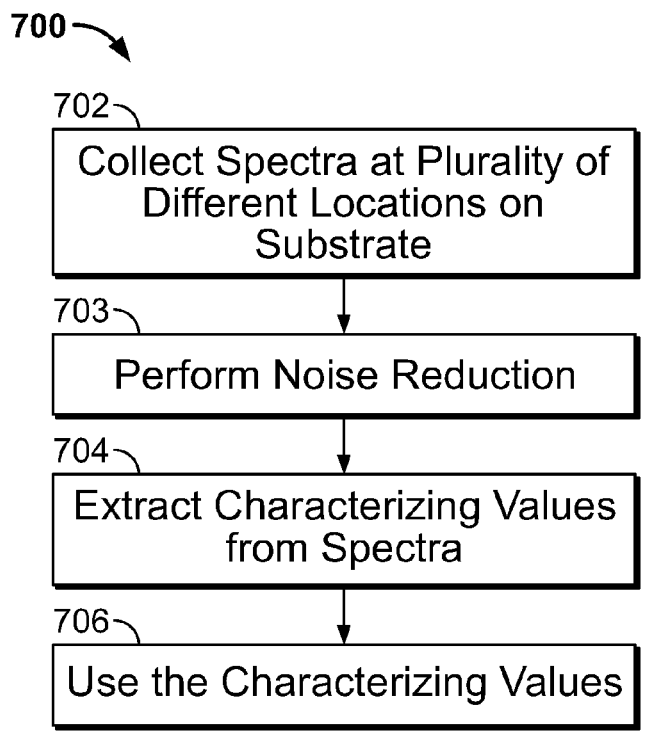
FIG. 7 is a flow diagram of an example process that implements noise reduction in controlling a polishing operation.

FIG. 7 shows an example process 700 of implementing the noise reduction discussed above in controlling polishing of a product substrate. A plurality of spectra reflected from the product substrate are collected (702) at a plurality of different positions during one rotation of the platen. The spectra could be measured using an in-sequence optical monitoring system or an in-situ optical monitoring system. Noise reduction is performed (703) on the collected spectra. Optionally, before applying the noise reduction, the spectra may be sorted using a clustering algorithm such as the k-means clustering algorithm. The noise reduction can be performed on each cluster of spectra. An example of the noise reduction process is the process 800 of FIG. 6. Characterizing values, e.g., thicknesses, can be extracted (704) from the spectra with reduced noise. The characterizing values could be generated by identifying a matching reference spectrum from a library of reference spectra, or by fitting an optical model to the collected spectrum. The characterizing values are then used (706) in controlling polishing of the product substrate. For example, when the characterizing values are thicknesses, the calculated thicknesses can be compared with a predetermined value to determine the endpoint of the polishing process. In another example, thicknesses at different moments of the polishing process can be determined and a polishing rate can be derived from the thicknesses. The thicknesses can also be used to determine the criteria for dimension reduction in the noise reduction process. For example, the determined thicknesses can be compared with directly measured thicknesses to determine the effectiveness of the noise reduction process and/or adjust the criteria.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Although the description above has focused on control of a chemical mechanical polishing system, the in-sequence metrology station can be applicable to other types of substrate processing systems, e.g., etching or deposition systems.

Embodiments, such as noise reduction or controlling substrate polishing, of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory storage medium for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example a programmable digital processor, a digital computer, or multiple digital processors or computers. The apparatus can also be or further include special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a stand alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit). For a system of one or more computers to be "configured to" perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Control of the various systems and processes described in this specification, or portions of them, can be implemented in a computer program product that includes instructions that are stored on one or more non-transitory machine-readable storage media, and that are executable on one or more processing devices. The systems described in this specification, or portions of them, can be implemented as an apparatus, method, or electronic system that may include one or more processing devices and memory to store executable instructions to perform the operations described in this specification.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method of polishing comprising:
   polishing a substrate with a rotating polishing pad in a polishing system;
   measuring a multiplicity of spectra of light reflected from the substrate with an in-situ spectrographic monitoring system, the multiplicity of spectra including a plurality of spectra collected during a single rotation of the polishing pad from at a plurality of different positions on the substrate, the plurality of spectra represented in the form of a first matrix, each spectrum of the plurality of spectra being represented by a dataset arranged in a single row or a single column of the first matrix;
   decomposing the first matrix into products of at least two component matrixes of a first set of component matrixes;
   reducing dimensions of each of the at least two component matrixes to produce a second set of component matrixes containing the at least two matrixes with reduced dimensions;
   generating a second matrix by taking a product of the matrixes of the second set of component matrixes, the second matrix having the same dimensions as the first matrix, and each single row or each single column of the second matrix comprising a modified dataset representing a modified spectrum corresponding to the spectrum represented by a respective single row or single column of the first matrix; and
   controlling the polishing system based on the second matrix.

2. The method of claim 1, comprising generating a characterizing value based on the second matrix, the characterizing value being associated with a property of the substrate, and controlling the polishing operation based on the characterizing value.

3. The method of claim 1, comprising grouping spectra from the multiplicity of spectra into different groups, each different group of spectra including a plurality of spectra collected during a single rotation of the polishing pad and represented by a first matrix.

4. The method of claim 3, wherein the plurality of spectra within a group are reflected from regions of an outer layer of the substrate that have substantially the same thickness, and the different groups have spectra reflected from regions of the outer layer of the substrate that have different thicknesses.

5. The method of claim 1, wherein decomposing the first matrix comprises applying singular value decomposition, applying CUR matrix approximation, or applying principal component analysis.

6. A polishing system, comprising:
   a rotatable support to hold a polishing pad;
   a carrier head to hold a substrate in contact with the polishing pad;
   a motor to rotate the support;
   an in-situ spectrographic monitoring system configured to measure a multiplicity of spectra of light reflected from the substrate during polishing; and
   a controller configured to
      receive the multiplicity of spectra of light from the in-situ spectrographic monitoring system,
      collect, from the multiplicity of spectra, a plurality of spectra collected during a single rotation of the polishing pad from at a plurality of different positions on the substrate, the plurality of spectra represented in the form of a first matrix, each spectrum of the plurality of spectra being represented by a dataset arranged in a single row or a single column of the first matrix,
      decompose the first matrix into products of at least two component matrixes of a first set of component matrixes,
      reduce dimensions of each of the at least two component matrixes to produce a second set of component matrixes containing the at least two matrixes with reduced dimensions,
      generate a second matrix by taking a product of the matrixes of the second set of component matrixes, the second matrix having the same dimensions as the first matrix, and each single row or each single column of the second matrix comprising a modified dataset representing a modified spectrum corresponding to the spectrum represented by a respective single row or single column of the first matrix, and
      control the polishing system based on the second matrix.

7. The system of claim 6, wherein the controller is configured to generate a characterizing value based on the second matrix, the characterizing value being associated with a property of the substrate, and to control the polishing system based on the characterizing value.

8. The system of claim 7, wherein the controller is configured to determine a polishing endpoint for the substrate based on the characterizing value.

9. The system of claim 6, wherein the controller is configured to group spectra from the multiplicity of spectra into different groups, each different group of spectra including a plurality of spectra collected during a single rotation of the polishing pad and represented by a first matrix.

10. The system of claim 9, wherein the plurality of spectra within a group are reflected from regions of an outer layer of the substrate that have substantially the same thickness, and the different groups have spectra reflected from regions of the outer layer of the substrate that have different thicknesses.

11. The system of claim 6, wherein the controller is configured to decompose the first matrix by applying singular value decomposition, CUR matrix approximation, or principal component analysis.

12. The system of claim 6, wherein the controller is configured to reduce dimensions of each of the at least two component matrixes by to i) truncate one or more columns and/or one or more rows of each of the at least two component matrixes, or ii) replace all non-zero values of one or more columns or rows of matrix elements with zeros.

13. The system of claim 12, wherein the controller is configured to truncate or replace non-zero values of one or more columns or rows in which nonzero matrix elements have a value smaller than a predetermined percentage of values of all nonzero matrix elements of the diagonal matrix.

14. The system of claim 13, wherein the predetermined percentage is 80% or higher.

15. The system of claim 12, wherein the controller is configured to truncate or replace non-zero values of columns or rows by eliminating or retaining a predetermined number of columns or rows.

* * * * *

UNITED STATES PATENT AND TRADEMARK OFFICE
CERTIFICATE OF CORRECTION

PATENT NO. : 9,833,874 B2
APPLICATION NO. : 15/400183
DATED : December 5, 2017
INVENTOR(S) : Jeffrey Drue David, Boguslaw A. Swedek and Benjamin Cherian It is certified that error appears in the above-identified patent and that said Letters Patent is hereby corrected as shown below:

In the Specification

Column 1, Line 9, delete "Apr. 30, 2015" and insert -- October 25, 2013 -- therefor.

Signed and Sealed this
Twentieth Day of February, 2018

Andrei Iancu
*Director of the United States Patent and Trademark Office*